United States Patent
Song et al.

(10) Patent No.: US 9,865,822 B2
(45) Date of Patent: Jan. 9, 2018

(54) BLUE PHOSPHORESCENCE COMPOUND AND ORGANIC LIGHT EMITTING DIODE USING THE SAME

(71) Applicant: LG Display Co., Ltd., Seoul (KR)

(72) Inventors: Inbum Song, Seoul (KR); Sukyoung Bae, Seoul (KR)

(73) Assignee: LG Display Co., Ltd., Seoul (KR)

( * ) Notice: Subject to any disclaimer, the term of this patent is extended or adjusted under 35 U.S.C. 154(b) by 464 days.

(21) Appl. No.: 14/066,838

(22) Filed: Oct. 30, 2013

(65) Prior Publication Data

US 2014/0138652 A1   May 22, 2014

(30) Foreign Application Priority Data

Nov. 22, 2012  (KR) .................. 10-2012-0132847

(51) Int. Cl.
  *H01L 51/50*  (2006.01)
  *H01L 51/00*  (2006.01)

(52) U.S. Cl.
  CPC ...... *H01L 51/0072* (2013.01); *H01L 51/0073* (2013.01); *H01L 51/5016* (2013.01)

(58) Field of Classification Search
  None
  See application file for complete search history.

(56) References Cited

U.S. PATENT DOCUMENTS

2009/0066226 A1\* 3/2009 Sugita ............... C07D 405/14
                                                    313/504
2009/0131673 A1  5/2009 Tanabe et al.

FOREIGN PATENT DOCUMENTS

| CN | 101184822 A | 5/2008 | | |
|---|---|---|---|---|
| WO | 2006114966 A1 | 11/2006 | | |
| WO | WO 2008/035571 | * | 3/2008 | ............. H01L 51/50 |
| WO | 2010044342 A1 | 4/2010 | | |
| WO | 2012098996 A1 | 7/2012 | | |

OTHER PUBLICATIONS

Chinese Office Action dated Jul. 2, 2015, for corresponding Chinese Patent Application No. 201310571986.3.

\* cited by examiner

*Primary Examiner* — Gregory Clark
(74) *Attorney, Agent, or Firm* — Morgan, Lewis & Bockius LLP

(57) ABSTRACT

A blue phosphorescence compound and an organic light emitting diode using the same are disclosed. The blue phosphorescence compound is represented by Chemical Formula 1 below:

[Chemical Formula 1]

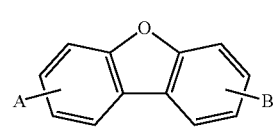

wherein 'A' and 'B' are symmetrically or asymmetrically substituted at positions of Nos. 2 and 7 or Nos. 3 and 6 of dibenzofuran core and are independently formed of an aromatic cyclic compound or a heterocyclic compound.

4 Claims, 3 Drawing Sheets

BLUE PHOSPHORESCENCE COMPOUND AND ORGANIC LIGHT EMITTING DIODE USING THE SAME

This application claims the priority benefit of Korean Patent Application No. 10-2012-0132847 filed on Nov. 22, 2012, which is incorporated herein by reference for all purposes as if fully set forth herein.

BACKGROUND OF THE INVENTION

Field of the Invention

Embodiments of the invention relate to a blue phosphorescence compound and an organic light emitting diode using the same, and more particularly, to an organic light emitting diode using a high efficiency blue phosphorescence compound having high triplet energy as a host of a light emitting layer.

Discussion of the Related Art

The importance of flat panel displays is recently increasing with the growth of multimedia. Thus, various types of flat panel displays such as a liquid crystal display (LCD), a plasma display panel (PDP), a field emission display (FED), and an organic light emitting display have been put to practical use to meet this trend.

The organic light emitting display has advantages in that it can have elements formed even on a flexible substrate formed of, for example, plastic, can be driven at a low voltage of about 10V or less as compared with a plasma display panel or an inorganic light emitting display, and can have comparatively low power consumption and excellent feeling of color. Further, because the organic light emitting display can represent three colors of red, green, and blue, it has attracted the attention of many people as a next generation display representing full colors.

An organic light emitting diode may be formed by sequentially stacking an anode, a hole injection layer, a hole transport layer, a light emitting layer, an electron transport layer, an electron injection layer, and a cathode. In the organic light emitting diode, holes injected from the anode and electrons injected from the cathode are recombined with each other to generate excitons. A fluorescence material used as a material of the light emitting layer is concerned in the generation of singlet excitons, and a phosphorescence material used as the material of the light emitting layer is concerned in the generation of triplet excitons. There is a recent trend in which the material of the light emitting is changed from the fluorescence material to the phosphorescence material. This is because only singlet excitons of about 25% among the excitons generated in the light emitting layer formed of the fluorescence material are used to generate light, and most of triplet excitons of about 75% are converted into heat and disappear. On the other hand, most of excitons generated in the light emitting layer formed of the phosphorescence material are converted into light.

In a light emitting process using a phosphorescence element, holes injected from the anode and electrons injected from the cathode meet each other in a host material of the light emitting layer. Further, the holes and the electrons may meet each other in a dopant material of the light emitting layer. However, because a concentration of a host is generally high, the holes and the electrons mainly meet in the host. In this instance, an energy level of singlet excitons generated in the host is transferred to a singlet energy level or a triplet energy level of a dopant, and an energy level of triplet excitons generated in the host is transferred to the triplet energy level of the dopant.

Further, the excitons transferred to the singlet energy level of the dopant are again transferred to the triplet energy level of the dopant through intersystem crossing. Thus, all of the excitons are first transferred to the triplet energy level of the dopant. The excitons thus formed are transferred to a ground state and generate light. When triplet energy levels of the hole transport layer and the electron transport layer positioned in the front or in the rear of the light emitting layer are less than the triplet energy level of the dopant, a reverse energy transition from the dopant or the host to the hole transport layer and the electron transport layer is generated. Hence, efficiency of the organic light emitting diode is sharply reduced. Thus, not only the host material of the light emitting layer but also the triplet energy levels of the hole and electron transport layers greatly affect the phosphorescence element.

For the effective energy transition from the host to the dopant, the triplet energy level of the host has to be greater than the triplet energy level of the dopant. However, because a triplet energy level of carbazole biphenyl (CBP), which is recently widely used as the host, is about 2.6 eV, a reverse energy (heat absorption) transition from the CBP host to a well-known Flrpic phosphorescence dopant is generated. Hence, the efficiency of the organic light emitting diode is reduced. Thus, the development of a new phosphorescence material having a high triplet energy level and excellent thermal stability is urgently needed.

SUMMARY OF THE INVENTION

Embodiments of the invention provide an organic light emitting diode using a high efficiency blue phosphorescence compound having high triplet energy as a host of a light emitting layer.

In one aspect, there is a blue phosphorescence compound represented by Chemical Formula 1 below:

[Chemical Formula 1]

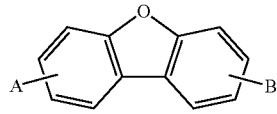

wherein 'A' and 'B' are symmetrically or asymmetrically substituted at positions of Nos. 2 and 7 or Nos. 3 and 6 of dibenzofuran core and are independently formed of an aromatic cyclic compound or a heterocyclic compound.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
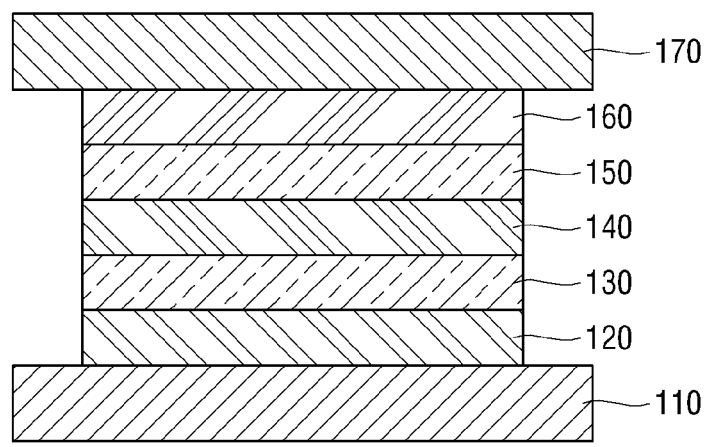
FIG. 1 illustrates an organic light emitting diode according to an exemplary embodiment of the invention.

FIG. 1 illustrates an organic light emitting diode according to an exemplary embodiment of the invention.

As shown in FIG. 1, an organic light emitting diode 100 according to an exemplary embodiment of the invention includes an anode 110, a hole injection layer 120, a hole transport layer 130, a light emitting layer 140, an electron transport layer 150, an electron injection layer 160, and a cathode 170.

The anode 110, into which holes are injected, may be formed of any one of indium tin oxide (ITO), indium zinc oxide (IZO), and zinc oxide (ZnO), each of which has a high work function. Other materials may be used for the anode 110. In addition, when the anode 110 is a reflective electrode, the anode 110 may further include a reflective layer formed of any one of aluminum (Al), silver (Ag), and nickel (Ni), under a layer formed of any one of ITO, IZO, and ZnO.

The hole injection layer 120 functions to facilitate the injection of holes into the light emitting layer 140 from the anode 110. The hole injection layer 120 may be formed of at least one selected from the group consisting of cupper phthalocyanine (CuPc), poly(3,4)-ethylenedioxythiophene (PEDOT), polyaniline (PANI), and N,N-dinaphthyl-N,N'-diphenyl benzidine (NPD). Other materials may be used.

The hole injection layer 120 has a thickness of about 1 nm to 150 nm. When the thickness of the hole injection layer 120 is equal to or greater than about 1 nm, the hole injection layer 120 may prevent a reduction in hole injection characteristics. When the thickness of the hole injection layer 120 is equal to or less than about 150 nm, the hole injection layer 120 may prevent an increase in a driving voltage, which may be caused so as to improve the movement of holes when the hole injection layer 120 is too thick.

The hole transport layer 130 functions to facilitate the transport of holes. The hole transport layer 130 may be formed of at least one selected from the group consisting of N,N-dinaphthyl-N,N'-diphenyl benzidine (NPD), N,N'-bis-(3-methylphenyl)-N,N'-bis-(phenyl)-benzidine (TDN), s-TAD, and 4,4',4''-tris(N-3-methylphenyl-N-phenyl-amino)-triphenylamine (MTDATA). Other materials may be used.

The hole transport layer 130 has a thickness of about 5 nm to 150 nm. When the thickness of the hole transport layer 130 is equal to or greater than about 5 nm, the hole transport layer 130 may prevent a reduction in hole transport characteristics. When the thickness of the hole transport layer 130 is equal to or less than about 150 nm, the hole transport layer 130 may prevent an increase in the driving voltage, which may be caused so as to improve the movement of holes when the hole transport layer 130 is too thick.

The light emitting layer 140 may be formed of a material emitting red, green, and blue light and may be formed using a phosphorescence material or a fluorescence material. In the following description, the embodiment of the invention will describe the phosphorescence material emitting blue light.

The light emitting layer 140 according to the embodiment of the invention includes a host and a dopant. More specifically, the host of the light emitting layer 140 is formed of a blue phosphorescence compound represented by Chemical Formula 1 below:

[Chemical Formula 1]

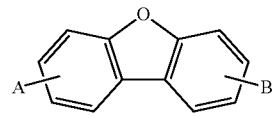

In the above Chemical Formula 1, 'A' and 'B' are symmetrically or asymmetrically substituted at positions of Nos. 2 and 7 or Nos. 3 and 6 of dibenzofuran core and are independently formed of an aromatic cyclic compound or a heterocyclic compound.

Each of 'A' and 'B' is independently formed of any one selected among carbazole group, α-carboline group, β-carboline group, γ-carboline group, dibenzofuran group, phenyl group, and pyridine group.

Each of 'A' and 'B' may be independently any one selected among compounds represented by chemical formulas below.

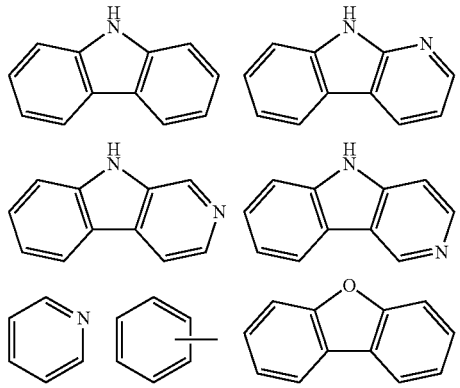

The blue phosphorescence compound may be any one of compounds represented by chemical formulas below.

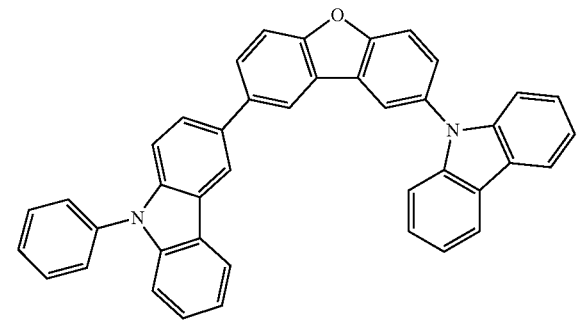

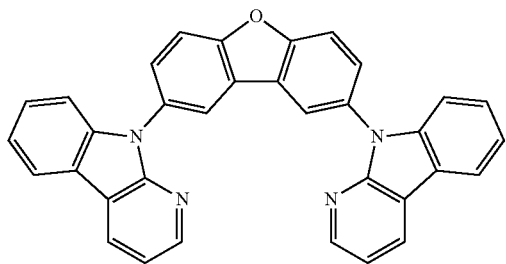

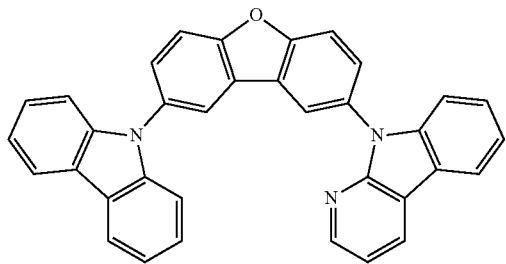

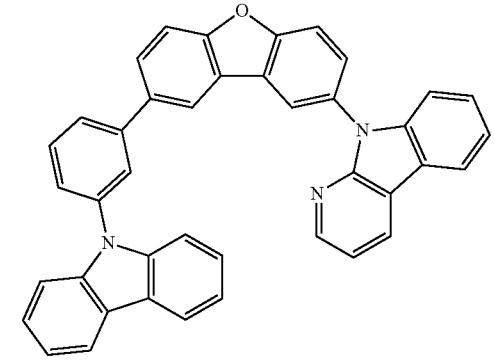

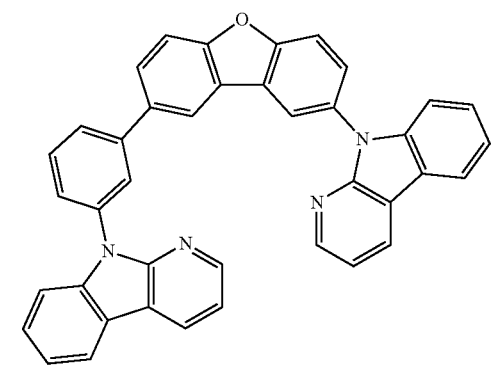

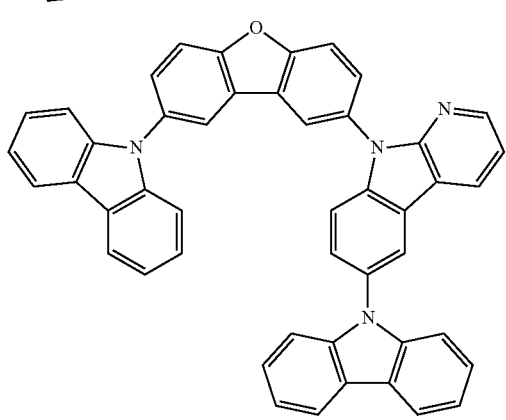

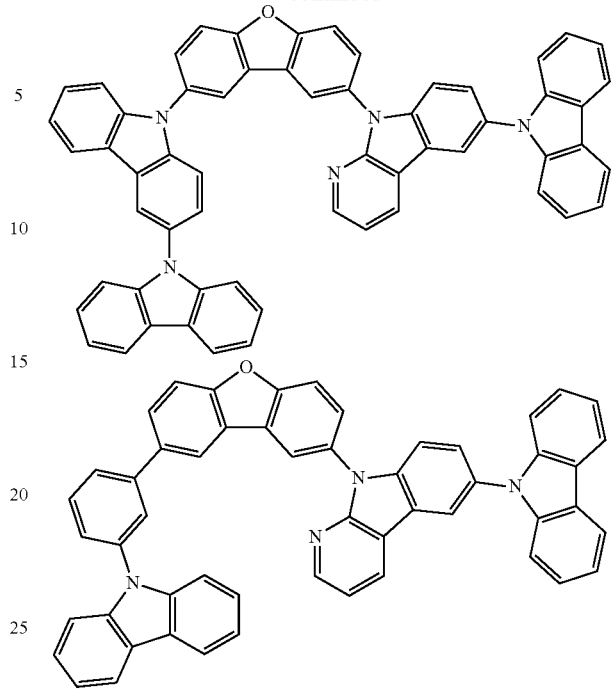

The dopant mixed in the host of the light emitting layer 140 is formed of iridium compound such as Flrppy and Flrpic. The light emitting layer 140 may include 0.1 to 50 wt % of the dopant based on 100 wt % of the host.

The electron transport layer 150 functions to facilitate the transport of electrons. The electron transport layer 150 may be formed of at least one selected from the group consisting of Alq3 (tris(8-hydroxyquinolino)aluminum), PBD, TAZ, spiro-PBD, BAlq, and SAlq. Other materials may be used.

The electron transport layer 150 has a thickness of about 1 nm to 50 nm. When the thickness of the electron transport layer 150 is equal to or greater than about 1 nm, the electron transport layer 150 may prevent a reduction in electron transport characteristics. When the thickness of the electron transport layer 150 is equal to or less than about 150 nm, the electron transport layer 150 may prevent an increase in the driving voltage, which may be caused so as to improve the movement of electrons when the electron transport layer 150 is too thick.

The electron injection layer 160 functions to facilitate the injection of electrons. The electron injection layer 160 may be formed of any one selected from the group consisting of Alq3 (tris(8-hydroxyquinolino)aluminum), PBD, TAZ, spiro-PBD, BAlq, and SAlq. Other materials may be used.

The electron injection layer 160 has a thickness of about 1 nm to 50 nm. When the thickness of the electron injection layer 160 is equal to or greater than about 1 nm, the electron injection layer 160 may prevent a reduction in electron injection characteristics. When the thickness of the electron injection layer 160 is equal to or less than about 50 nm, the electron injection layer 160 may prevent an increase of the driving voltage, which may be caused so as to improve the movement of electrons when the electron injection layer 160 is too thick.

The cathode 170 is an electron injection electrode and may be formed of magnesium (Mg), calcium (Ca), aluminum (Al), silver (Ag), or an alloy thereof, each of which has a low work function. When the organic light emitting diode has a top emission type or a double emission type, the cathode 170 may be thin enough to transmit light therethrough. When the organic light emitting diode has a bottom emission type, the cathode 170 may be thick enough to reflect light therefrom.

Hereinafter, synthetic examples of the blue phosphorescence compound according to the embodiment of the invention and synthetic examples and examples concerned in characteristics of the blue phosphorescence compound will be described. However, the following examples are for merely exemplifying the embodiment of the invention, and therefore do not limit the embodiment of the invention.

SYNTHETIC EXAMPLES

1) Manufacture of 2,7-diiododibenzofuran

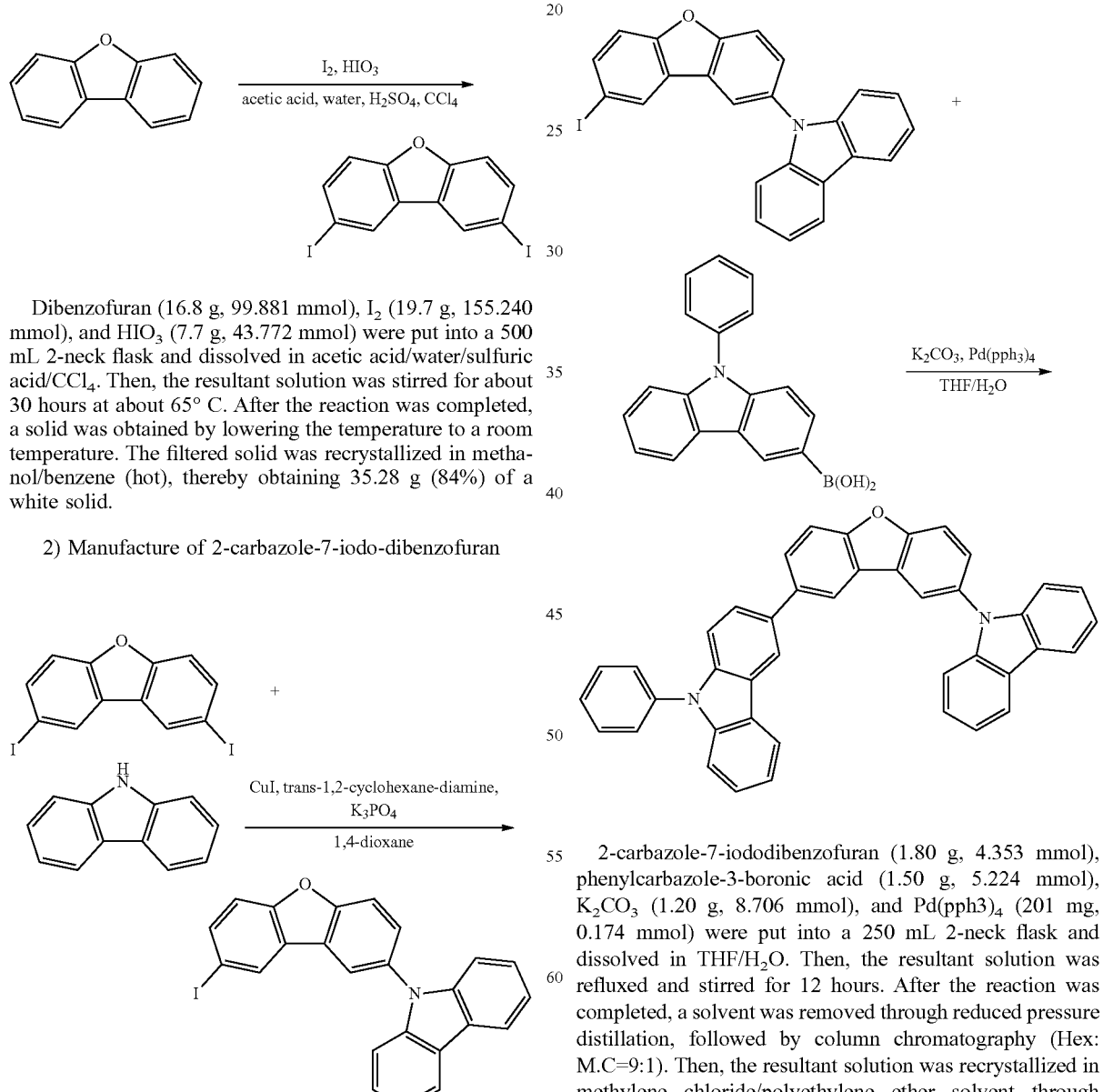

Dibenzofuran (16.8 g, 99.881 mmol), I$_2$ (19.7 g, 155.240 mmol), and HIO$_3$ (7.7 g, 43.772 mmol) were put into a 500 mL 2-neck flask and dissolved in acetic acid/water/sulfuric acid/CCl$_4$. Then, the resultant solution was stirred for about 30 hours at about 65° C. After the reaction was completed, a solid was obtained by lowering the temperature to a room temperature. The filtered solid was recrystallized in methanol/benzene (hot), thereby obtaining 35.28 g (84%) of a white solid.

2) Manufacture of 2-carbazole-7-iodo-dibenzofuran 2,7-diiododibenzofuran (10.0 g, 23.80 mmol), carbazole (2.21 g, 13.20 mmol), CuI (756 mg, 3.97 mmol), K$_3$PO$_4$ (5.61 g, 26.50 mmol), and trans-1,2-cyclohexanediamine (0.479 mL, 3.97 mmol) were put into a 250 mL 2-neck flask and dissolved in 1,4-dioxane. Then, the resultant solution was refluxed and stirred for 12 hours. After the reaction was completed, a solvent was removed through reduced pressure distillation, followed by column chromatography (Hex:M.C=9:1). Then, the resultant solution was recrystallized in methylenechloride/polyethylene ether solution through reduced pressure distillation, thereby obtaining 2.40 g (40%) of a white solid.

3) Manufacture of First Host 2-carbazole-7-iododibenzofuran (1.80 g, 4.353 mmol), phenylcarbazole-3-boronic acid (1.50 g, 5.224 mmol), K$_2$CO$_3$ (1.20 g, 8.706 mmol), and Pd(pph3)$_4$ (201 mg, 0.174 mmol) were put into a 250 mL 2-neck flask and dissolved in THF/H$_2$O. Then, the resultant solution was refluxed and stirred for 12 hours. After the reaction was completed, a solvent was removed through reduced pressure distillation, followed by column chromatography (Hex:M.C=9:1). Then, the resultant solution was recrystallized in methylene chloride/polyethylene ether solvent through reduced pressure distillation, thereby obtaining 0.77 g (31%) of a white solid.

4) Manufacture of Second Host

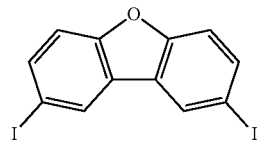

+

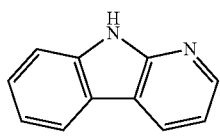

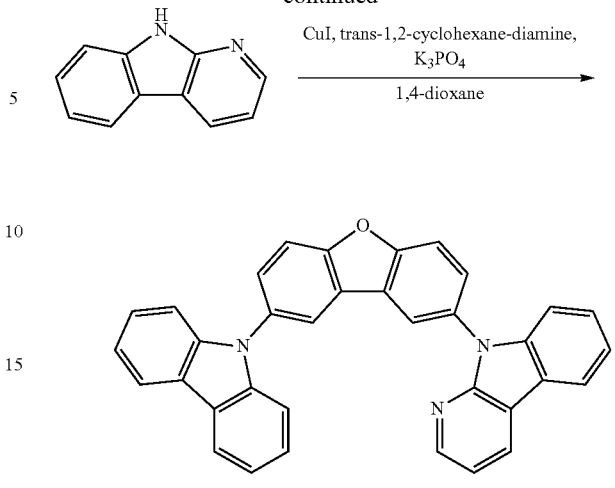

2-carbazole-7-iododibenzofuran (1.2 g, 2.613 mmol), carboline (439 mg, 2.163 mmol), CuI (199 mg, 1.045 mmol), $K_3PO_4$ (1.11 g, 5.226 mmol), and trans-1,2-cyclohexanediamine (0.125 mL, 1.045 mmol) were put into a 250 mL 2-neck flask and dissolved in 1,4-dioxane. Then, the resultant solution was refluxed and stirred for 12 hours. After the reaction was completed, a solvent was removed through reduced pressure distillation, followed by column chromatography (Hex:M.C=3:2). Then, the resultant solution was recrystallized in methylene chloride/polyethylene ether solvent through reduced pressure distillation, thereby obtaining 0.84 g (64%) of a white solid.

2,7-diiododibenzofuran (3.79 g, 9.024 mmol), carboline (3.49 g, 20.756 mmol), CuI (1.37 g, 7.219 mmol), $K_3PO_4$ (11.50 g, 54.144 mmol), and trans-1,2-cyclohexanediamine (0.867 mL, 7.219 mmol) were put into a 250 mL 2-neck flask and dissolved in 1,4-dioxane. Then, the resultant solution was refluxed and stirred for 12 hours. After the reaction was completed, a solvent was removed through reduced pressure distillation, followed by column chromatography (Hex:E.A=7:1→4:1). Then, the resultant solution was recrystallized in methylene chloride/polyethylene ether solvent through reduced pressure distillation, thereby obtaining 2.81 g (62%) of a white solid.

6) Manufacture of 2-carboline-7-iododibenzofuran

5) Manufacture of Third Host 2,7-diiododibenzofuran (9.06 g, 21.572 mmol), carboline (1.81 g, 10.786 mmol), CuI (821 mg, 4.314 mmol), $K_3PO_4$ (3.4 g, 16.179 mmol), and trans-1,2-cyclohexanediamine (0.518 mL, 4.314 mmol) were put into a 250 mL 2-neck flask and dissolved in 1,4-dioxane. Then, the resultant solution was refluxed and stirred for 12 hours. After the reaction was completed, a solvent was removed through reduced pressure distillation, followed by column chromatography (Hex 100%→Hex:E.A=9:1). Then, the resultant solution was recrystallized in methylene chloride/polyethylene ether solvent through reduced pressure distillation, thereby obtaining 1.97 g (40%) of a white solid.

7) Manufacture of Fourth Host

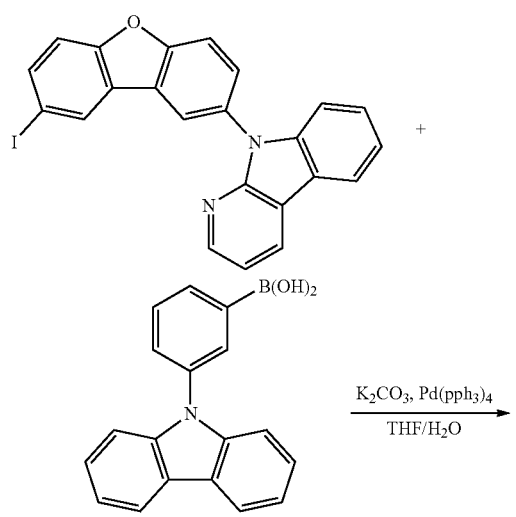

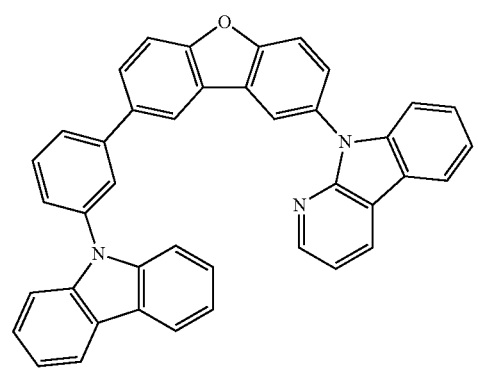

2-carboline-7-iododibenzofuran (1.91 g, 4.150 mmol), 3-boronic acid-phenylcarbazole (1.43 g, 4.980 mmol), $K_2CO_3$ (1.15 g, 8.300 mmol), and Pd(pph3)$_4$ (192 mg, 0.166 mmol) were put into a 250 mL 2-neck flask and dissolved in THF/H$_2$O. Then, the resultant solution was refluxed and stirred for 12 hours. After the reaction was completed, a solvent was removed through reduced pressure distillation, followed by decoloration through short column using toluene and column chromatography (Hex:M.C=4:1→2:1). Then, the resultant solution was recrystallized in methylene chloride/polyethylene ether solvent through reduced pressure distillation, thereby obtaining 1.23 g (51%) of a white solid.

8) Manufacture of 7-carbazole-dibenzofuran-2-boronic acid

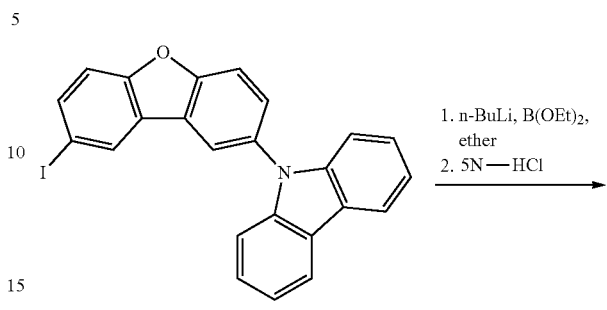

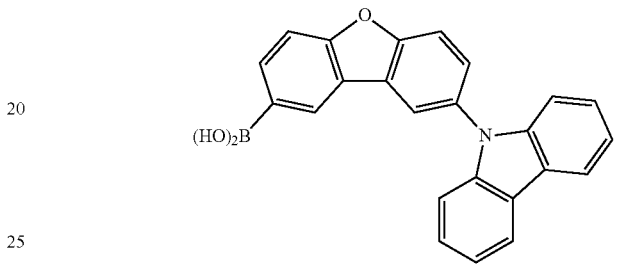

2-carbazole-7-iododibenzofuran (3.28 g, 7.140 mmol) was put into a 250 mL 2-neck flask and was dissolved in ether, followed by a reduction in the temperature. Then, 4.28 mL of n-BuLi (2.5M) was slowly added thereto and was stirred for 2 hours at the room temperature, followed by a reduction in the temperature again. Then, 2.1 mL of triethylborate was added thereto and stirred for 3 hours. Then, hydrochloric acid solution (5N) was put into the flask and stirred. A solid produced after the completion of the reaction was washed with polyethylene, thereby obtaining 1.15 g (44%) of a white solid.

9) Manufacture of Fifth Host

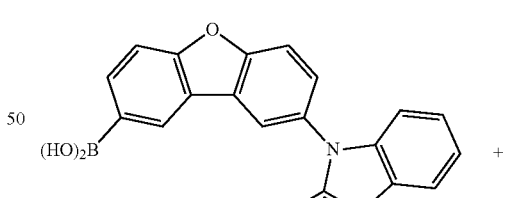

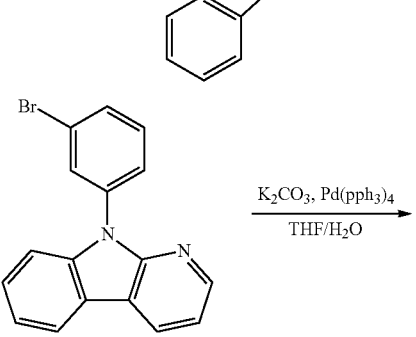

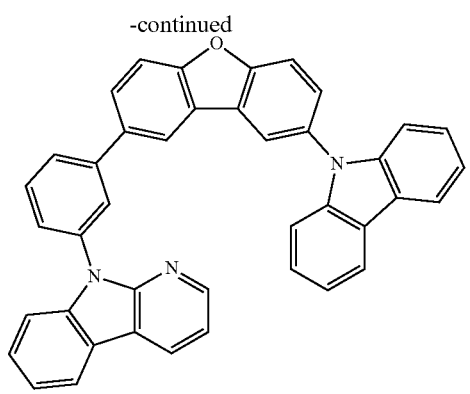

7-carbazole-dibenzofuran-2-boronic acid (1.15 g, 3.050 mmol), 3-bromo-phenylcarboline (0.99 g, 3.050 mmol), $K_2CO_3$ (1.26 g, 9.150 mmol), and $Pd(pph3)_4$ (0.106 g, 0.0915 mmol) were put into a 250 mL 2-neck flask and dissolved in $THF/H_2O$. Then, the resultant solution was refluxed and stirred for 12 hours. After the reaction was completed, a solvent was removed through reduced pressure distillation, followed by decoloration through short column using toluene and column chromatography (Hex:M.C=4:1→2:1). Then, the resultant solution was recrystallized in methylene chloride/polyethylene ether solvent through reduced pressure distillation, thereby obtaining 1.0 g (57%) of a white solid.

UV absorption spectrum and photoluminescence (PL) spectrum at a low temperature (for example, 77K) with respect to the first to fifth host materials manufactured by the above-described synthetic examples according to the embodiment of the invention and a material of a comparative example represented by Chemical Formula 2 below were measured, and a result thereof was shown in FIGS. 2 and 3 and the following Table 1.

Figure 2:
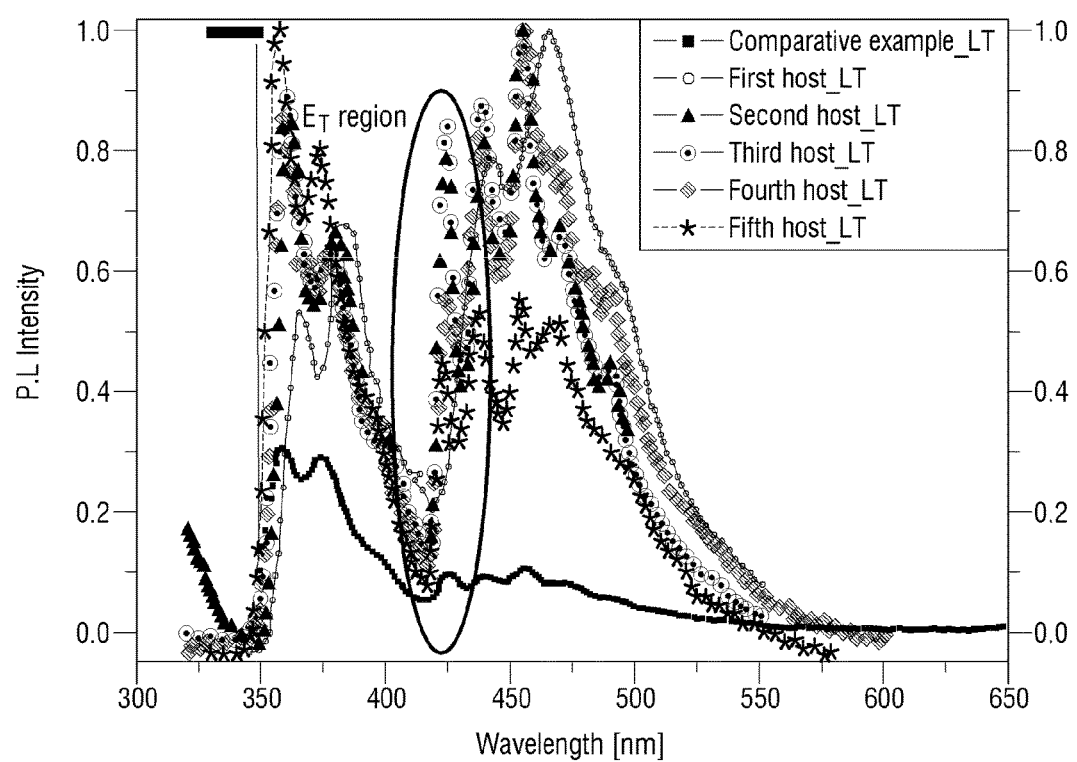
FIGS. 2 and 3 are graphs indicating UV absorption spectrum and photoluminescence (PL) spectrum at a low temperature (for example, 77K) with respect to first to fifth host materials according to an exemplary embodiment of the invention and a material of a comparative example represented by a Chemical Formula 2.
Figure 3:
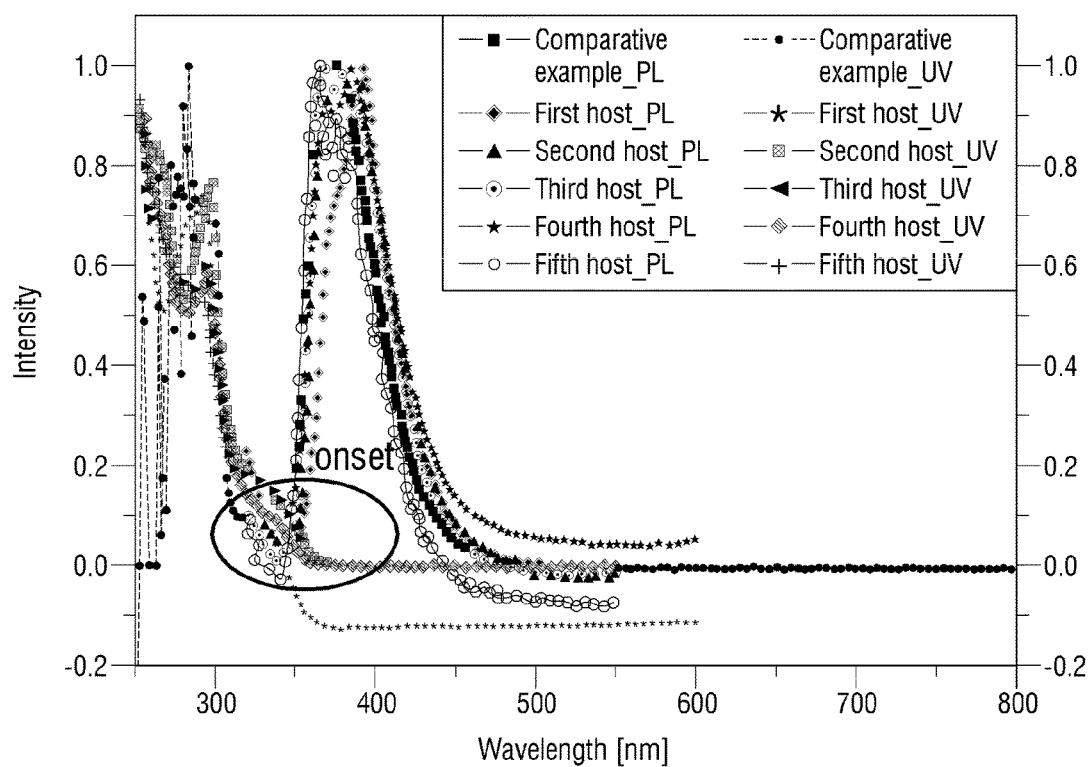

As indicated by FIGS. 2 and 3 and the above Table 1, triplet energy levels of the second to fifth host materials manufactured according to the embodiment of the invention were higher than a triplet energy level '2.92 eV' of the comparative example.

Manufacturing examples of an organic light emitting diode using a blue phosphorescence compound formed of the above-described second and third host materials and the material of the comparative example as a blue host are described below.

Manufacturing Example 1

An ITO substrate was patterned to have a light emitting area of 3 mm×3 mm and then washed. After the ITO substrate was installed in a vacuum chamber, a base pressure was made to be $1×10^{-6}$ torr. Then, on ITO for forming an anode, HAT-CN for a hole injection layer was formed with a thickness of about 50 Å, NPD for a hole transport layer was formed with a thickness of about 550 Å, TAPC for an electron blocking layer was formed with a thickness of about 100 Å, and the second host material having a thickness of about 300 Å as a host and [FCNIr] having a doping concentration of about 15% as a dopant were formed for a light emitting layer. Then, TmPyPb for an electron transport layer was formed with a thickness of about 400 Å, LiF for an electron injection layer was formed with a thickness of about 5 Å, and Al for a cathode was formed with a thickness of about 1,100 Å. Then, an encapsulation process using UV curable epoxy and a moisture getter was performed, thereby manufacturing an organic light emitting diode.

[Chemical Formula 2]

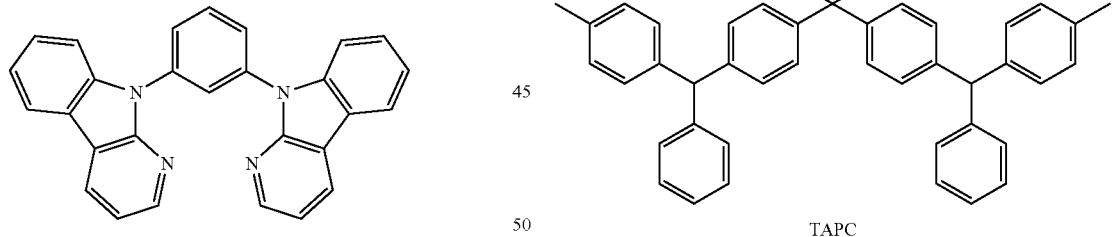

TAPC

TABLE 1

| | Wavelength at maximum UV absorption spectrum (nm) | Wavelength at maximum PL spectrum (nm) | Energy band gap | LUMO level (eV) | HOMO level (eV) | Triplet energy level (eV) |
|---|---|---|---|---|---|---|
| Comparative example | 365 | 425 | 3.40 | −2.43 | −5.83 | 2.92 |
| First host | 358 | 443 | 3.47 | −2.18 | −5.65 | 2.80 |
| Second host | 362 | 424 | 3.43 | −2.25 | −5.68 | 2.93 |
| Third host | 355 | 424 | 3.50 | −2.15 | −5.65 | 2.93 |
| Fourth host | 359 | 424 | 3.46 | −2.20 | −5.66 | 2.93 |
| Fifth host | 358 | 423 | 3.47 | −2.16 | 5.63 | 2.94 |

-continued

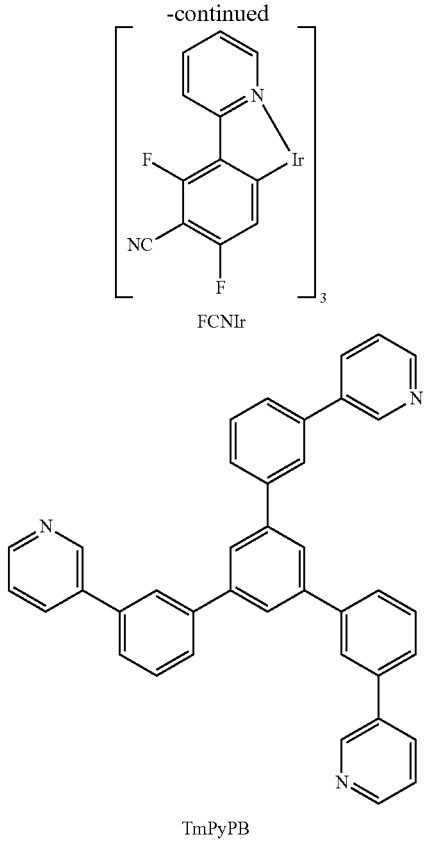

FCNIr

TmPyPB

Manufacturing Example 2

An organic light emitting diode was manufactured under the same process conditions as the above manufacturing example 1, only except that the third host material was used as a host of a light emitting layer.

COMPARATIVE EXAMPLE

An organic light emitting diode was manufactured under the same process conditions as the above manufacturing example 1, only except that a material represented by the above Chemical Formula 2 was used as a host of a light emitting layer.

Voltages, emission efficiencies, quantum efficiencies, color coordinates, and life spans of the organic light emitting diodes manufactured according to the manufacturing examples 1 and 2 and the comparative example above were measured and then tabulated in the following Table 2.

TABLE 2

| | Voltage (volts) | Emission efficiency | | Quantum efficiency (%) | Color coordinate | | Life span (T50, 700 nit) |
|---|---|---|---|---|---|---|---|
| | | Cd/A | lm/W | | CIE_x | CIE_y | |
| Comparative Example | 5.3 | 13.20 | 7.85 | 7.77 | 0.154 | 0.274 | 4 |
| Example 1 | 7.5 | 16.98 | 7.14 | 10.48 | 0.154 | 0.253 | 108 |
| Example 2 | 7.3 | 16.94 | 7.25 | 10.43 | 0.154 | 0.255 | 0 |

As indicated in the above Table 2, it was confirmed that the organic light emitting diode manufactured according to the manufacturing example 1 showed the improvement in the emission efficiency, the quantum efficiency, and the life span while showing the same level of color coordinates, as compared with the comparative example. In particular, the life span of the organic light emitting diode was greatly improved.

As described above, the embodiment of the invention manufactures the blue phosphorescence compound having the high triplet energy and uses the blue phosphorescence compound as the host of the light emitting layer of the organic light emitting diode, thereby facilitating the energy transition in the light emitting layer and improving the blue emission efficiency and the life span of the organic light emitting diode.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A blue phosphorescence dibenzofuran compound selected from the group consisting of:

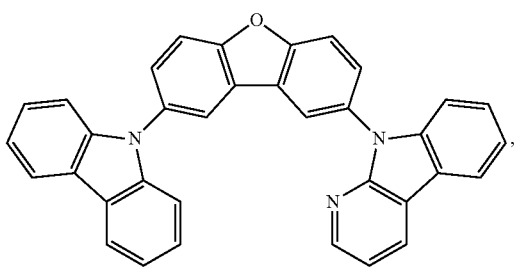

-continued

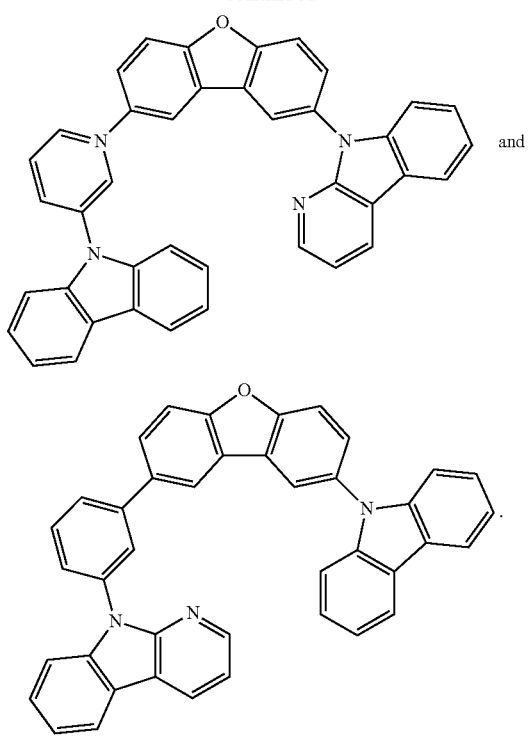

and

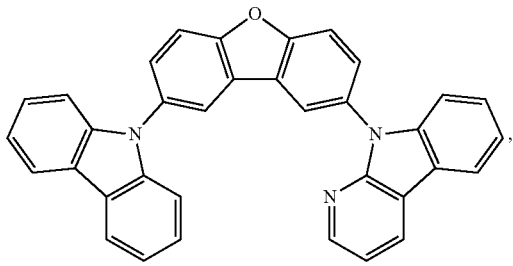

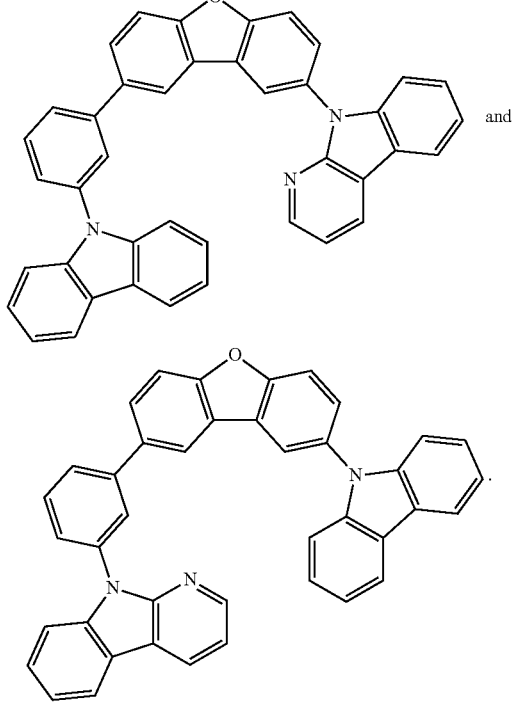

2. An organic light emitting diode comprising:
an anode,
a hole injection layer,
a hole transport layer,
a light emitting layer,
an electron transport layer,
an electron injection layer, and
a cathode,
which are sequentially stacked, and where the light emitting layer comprises a host that is a blue phosphorescence dibenzofuran compound selected from the group consisting of:

3. The organic light emitting diode of claim 2, wherein the light emitting layer emits blue light.

4. The organic light emitting diode of claim 2, wherein the compound of the host has a triplet energy level equal to or greater than about 2.90 eV.

* * * * *